US006041429A

United States Patent [19]
Koenemann

[11] Patent Number: 6,041,429
[45] Date of Patent: Mar. 21, 2000

[54] SYSTEM FOR TEST DATA STORAGE REDUCTION

[75] Inventor: Bernd Karl Ferdinand Koenemann, Hopewell Junction, N.Y.

[73] Assignee: International Business Machines Corporation, Armonk, N.Y.

[21] Appl. No.: 08/101,641

[22] Filed: Aug. 4, 1993

Related U.S. Application Data

[63] Continuation of application No. 07/534,600, Jun. 7, 1990, abandoned.

[51] Int. Cl.[7] ..................................................... G06F 11/00
[52] U.S. Cl. ........................................... 714/738; 714/726
[58] Field of Search ........................... 371/27, 21.2, 22.3; 714/738, 719, 720, 726, 727, 735

[56] References Cited

U.S. PATENT DOCUMENTS

| | | | |
|---|---|---|---|
| 4,513,418 | 4/1985 | Bardell | 371/22.3 |
| 4,519,078 | 5/1985 | Komonytsky | 371/27 X |
| 4,715,034 | 12/1987 | Jacobson | 371/29.1 X |
| 4,801,870 | 1/1989 | Eichelberger | 324/73 R |
| 4,903,266 | 2/1990 | Hack | 371/21.2 |
| 5,029,171 | 7/1991 | Lee | 371/27 |
| 5,175,494 | 12/1992 | Yoshimori | 371/22.3 X |
| 5,257,268 | 10/1993 | Agrawal | 371/27 |

OTHER PUBLICATIONS

International Test Conference 1940, IEEE, pp. 657–659 "Multiple Seed Linear Feedback Shift Register"by J. Saver, et al.
International Test Conference—1989–pp. 264–274, IEEE, "Hardware–Base Weighted Random Pattern Generation for Boundary Scan" by C. Gloster.
FTCS 16th Annual Inter Symposium, IEEE, pp. 404–409 "Pseudaex hausitive Test Pattern Generator with Enhanced Fault Coverage" by P. Golan et al.

*Primary Examiner*—Dieu-Minh T. Le
*Attorney, Agent, or Firm*—Lawerence D. Cutter

[57] ABSTRACT

A seed skipping mechanism is provided for use in conjunction with a linear feedback shift register used as a pseudo-random pattern generator for generating sequences of test bit streams for testing integrated circuit devices. The utilization of seed skipping for the pseudo-random pattern number generator in connection with weighting of the patterns from the random pattern generator provides an effective and low cost solution to data storage problems associated with generating effective test patterns for testing integrated circuit chip devices.

4 Claims, 2 Drawing Sheets

SYSTEM FOR TEST DATA STORAGE REDUCTION

This is a continuation of application Ser. No. 07/534,600 filed on Jun. 7, 1990, now abandoned.

BACKGROUND OF THE INVENTION

The present invention is generally directed to a system and method for providing test data to be applied to integrated circuit chips and chip systems as a means for testing functional logic circuitry present on the chip or in the system. More particularly, the present invention provides a coding method for reducing the amount of storage required for test data. This results in a reduction of the data volume stored in automatic test equipment and also eliminates ineffective patterns from weighted random pattern tests (also known as biased random pattern tests).

As electronic integrated circuit chip components have increased in density (as measured by the number of circuits per square millimeter), the corresponding problem of testing such circuits has also grown. In particular, it is desirous to be able to apply as many effective test patterns as possible to the chip in as small a time as possible so that the number of chips produced (including test) per period of time from a given manufacturing facility is as large as possible without producing defective devices. Accordingly, it is seen that the time that it takes to perform a thorough test is a significant factor in designing the equipment to perform the tests.

In general, there are two different approaches to the generation of test patterns. In deterministic or algorithmitic methods, software decoding techniques are used in test pattern generation software and also in the test equipment to construct a potentially large number of deterministic test patterns from a compact, coded representation. The other approach for generating test patterns is based upon the formation of weighted or biased random patterns. It is this latter approach to which the present application is directed.

Additionally, there are two categories of integrated circuits to which relevant test procedures are generally applied. A first category includes fairly regular circuit structures such as memories, register banks and the like while the second general category includes general functional logic which possesses much more irregularly configured arrangements of circuits and signal lines. The present application is more particularly directed to the testing of logic circuitry. However, the present invention is not limited thereto.

The concept of coded data representations for test pattern storage has been practiced in the past. In particular, diagnostic microcode is a good example of a method which algorithmically generates a typically very large number of test cases to exercise functional logic. Another known example of this type is found in the algorithmic pattern generation for memory arrays. As suggested above, expressing these patterns as stored stimulus/response data is employable, but consumes vast amounts of storage. To overcome this problem, memory test patterns are preferably generated algorithmically by programs. The trick in such cases is to exploit the regularity of the typical memory array test data to construct recursive, looped programs which are then executed in the test equipment (possibly with direct hardware support). The actual test patterns are produced by the executing program. The program itself is a compact, "coded" form representing the particular test data employed.

While such methods are useful for testing memory and array chips, it is difficult to be able to achieve a similar kind of coding efficiency for random logic functions. The data repetitions and recursions that work so well for memory type devices are not well suited for logic tests since the test pattern sequences for random logic seldom show any form of repetitive behavior. This is still generally true even though clock signal lines do exhibit a certain degree of organized structure. However, most other input signals exhibit little apparent regularity. Accordingly, to find effective coding forms for random logic, it is therefore necessary for one to look for other characteristics in test pattern streams.

One property useful in coding is the sparsity of information. For example, if the test pattern stream generated for a specific signal exhibits only relatively few signal changes, then it may be advantageous to store an initial signal value and the number of patterns between changes. Other such "characteristics" and associated codes can be defined. In fact, this is the basis of a "general purpose" test pattern compaction/decompaction method being developed under the label "universal pin electronics". See the article "Initial Physical Implementation Universal Pin Electronics" Autotest Con, 1984, pages 80 through 86 by P. C. Jackson, A. Esser and H. V. Marantz. Universal pin electronics (UPE) uses a repertoire of known data reduction algorithms to encode the information contained in arbitrary test pattern sets. No particular assumptions are made about how the patterns are originally generated. The effectiveness of this algorithm depends on the ability to identify the types of pattern characteristics which are exploited by the algorithms. These characteristics for example might include repetitiveness in clock lines and sparseness in reset lines. Up to a 30-fold data reduction has been reported for such algorithmic methods. The coding algorithms used for data compaction are complemented by hardware in the tester, which decompacts the data in real time. The original test pattern sequences are scrupulously reproduced without adding or subtracting patterns in such schemes.

An entirely different type of coding is exploited in pseudo-random pattern testing. Most of the pseudo-random pattern methods are based on pattern sequences generated with linear feedback shift registers (LFSRs). See for example "An Advanced Fault Isolation System" IEEE Transactions on Computers, 1975, Vol. C-24, pages 49 to 497 by N. Beneowitz, D. F. Calhoun, G. E. Alderson, J. E. Bauer and C. T. Joeckel. A linear feedback shift register typically comprises a serial arrangement of latches wherein specific latch outputs are feed back through Exclusive-OR gates (modulo 2 summers). Such devices are known in the art and are generally configured to cycle through as large a number of output sequences as possible through judicious choices for the feedback paths usually implemented with Exclusive-OR circuits. Such feedback registers (LFSRs) are cycled through a specified number of states to produce the desired test pattern sequence. Only the seed values (initial latch states) and the number of cycles are explicitly stored. In accordance with the present invention, only the seed values and the number of cycle times needed to produce the test pattern are stored. The LFSR is cycled the specified number of times to produce the desired test sequence. The effectiveness of this method depends on a test pattern characteristic that is referred to as "clustering" relative to the number of LFSR cycles. In particular, two test patterns are "close" to one another if they are generated within a few cycles of the LFSR. The success of pseudo-random pattern methods depends on the fact that in general a great many test patterns are clustered closely together near arbitrary seed values. That is to say, close test patterns occur within a reasonable number of LFSR cycles. The dual logarithm of the average number of LFSR cycles between two tests for a given fault is a useful metric which is sometimes referred to as the EAI (equivalent and-invert) value of the fault: EAI= $\log_2$ (average number of LFSR cycles between tests). Faults with small EAI values are usually detected within a few pseudo-random patterns, independent of the LFSR seed or initial value which is chosen.

Most real, complex circuits do nonetheless exhibit a large number of faults having large EAI values, and can therefore not be tested within any reasonable distance from any single seed value. However, the present applicant has perceived that many of these random pattern resistant faults exhibit a different kind of clustering characteristic. In particular, one intuitively expects that any test for such a fault sensitizes a hard to sensitize path in the circuit. By changing a few input values from such a test pattern, one can expect that different branches in the circuit will be connected to the sensitized path, thus, more faults will be detected. In other words, it is expected that tests for multiple faults, each with a possibly high EAI value, differ from each other in only a few bits. The number of bits with different values between code pattern sequences is generally referred to as the Hamming distance. The Hamming distance thus is a useful metric for quantifying test pattern clustering. Therefore, it is seen that test patterns within a short Hamming distance of one another are described in the form: (base vector) XOR (difference vector). The "difference vector" contains only a very few ones and mostly zeroes. It is therefore seen that it is possible to exploit the sparseness of these ones to arrive at a compact data representation for such tests.

The weighted random pattern approach provides an ingenious method for mapping patterns separated by short Hamming distances into shift register output patterns exhibiting short LFSR cycle distances. This occurs because weighted pseudo-random patterns are biased toward suitable base vectors. A weight value defines the strength of biasing. With strong biasing, the pattern generator has a tendency to generate vectors with a short Hamming distance around the chosen base vector within a few LFSR cycles. With a weaker bias, patterns with a low EAI value around the seed are generated. Thus by properly assigning bias to the test inputs to the circuit, one can optimally cover the tests for various different circuit areas with relatively few LFSR cycles. This results in shorter test times and greater facility throughput. An original description of the weighted random pattern testing concept can be found in the article by H. D. Schnurmann et al., titled "The Weighted Random Test-Pattern Generator", in the IEEE Transactions on Computers, Vol. C-24, No. 7, July 1975 at page 695 et seq. A practical implementation used in microchip testing is described in J. A. Waicukauski, et al., "A Method for Generating Weighted Random Test Patterns", IBM Journal of Research & Development, Vol. 33, No. 2, pp. 149–161, March 1989.

However, in its practical implementation, the weighted random pattern test system, just as in other pseudo-random pattern based methods applies test patterns to the circuit regardless of their effectiveness of detecting a previously untested model fault. The number of applied test patterns therefore tends to be significantly larger than that derived from conventional stored pattern methods which only apply relatively effective patterns. The additional patterns are useful because they increase the chances of accidentally detecting unmodeled faults. Thus, better test quality can be achieved than with conventional deterministic tests. This improved quality is however associated with the expense of a potentially significant increase in test application time.

Moreover, there are situations where the increase in test time is not economically justified by the increase in test quality. The economics are dictated by test throughput degradation due to increases in test length and by the expected effectiveness of unmodeled fault detection. It has been ascertained by the applicant herein that when tests are generated based upon the single stuck-at fault model, the weighted random pattern approach has proven to achieve a measurably better accidental delay fault detection rate than deterministic patterns. However, efforts to extend the fault model from single stuck-at faults to critical delay faults has the effect of including a large class of previously unmodeled faults into the set of explicitly modelled test objectives. One must expect therefore that the number of test patterns required to achieve high test coverage against that more stringent fault model will be significantly larger than the number of stuck-at fault test patterns. At the same time, the majority of faults previously discovered accidentally is now modeled, thus reducing the effectiveness of additional patterns. It is thus the case that removing ineffective test patterns from the weighted random pattern tests becomes more attractive. Accordingly, it is this approach which is employed in the present invention. Note also, that with delay testing, the number of test patterns needed for deterministic testing also increases to likely intolerable levels. In other words, it is anticipated that there will be an increasingly strong incentive to explore methodologies that allow the elimination of ineffective test patterns from a weighted random pattern test set while nonetheless retaining the advantages of the reduced explicit data storage volume. These methods can also be useful in other situations where the data transfer band width between the tester and the device under test limits the number of patterns that can be efficiently applied. For example, a service processor which is used for system level test is typically faced with such a problem. Here a small but effective test pattern set generated from a compact data representation would be very helpful.

SUMMARY OF THE INVENTION

By exploiting certain characteristics of test pattern sets, coding construction methods are employed to reduce the amount of stored data for test pattern generation. More particularly, a weighted random pattern generation methodology is employed in conjunction with seed skipping means to enhance test pattern effectiveness and reduce testing time.

Accordingly, in one embodiment of the present invention, a circuit is provided for generating sequences of test pattern bits. The circuit includes a pseudo-random pattern generator means having a number of register elements and a means for cycling the generator so as to produce an output bit stream. Weighting means receive the output bit stream and produce bit sequences having a selectively biased probability distribution of zeroes and ones. Reseeding means are employed for supplying seed values to be loaded into the register elements within the pseudo-random pattern generator means at the beginning of new output bit stream sequences. Finally, a seed skipping means is provided for causing the reseeding means to depart from a pre-established seed sequence by skipping over specified numbers of otherwise generated output bit stream sequences. In this way, ineffective test patterns are eliminated and at the same time the data storage requirements for test pattern production are significantly reduced.

Accordingly, it is an object of the present invention to reduce the time that it takes for automatic test equipment to evaluate integrated circuit chip devices and chip systems.

It is also an object of the present invention to provide a method and apparatus for producing more effective test patterns for integrated circuit chip evaluation purposes.

It is a still further object of the present invention to improve the utilization of biased or weighted random pattern test generation methodologies.

It is yet another object of the present invention to more thoroughly and completely test integrated circuit chip devices.

It is a still further object of the present invention to use weighted random pattern systems as a basis for generating deterministic test patterns which are representable in a very compact form.

It is yet another object of the present invention to more fully exploit fault simulators used in fault generation.

It is also an object of the present invention to integrate coding into the test generation algorithm.

Lastly, but not limited hereto, it is an object of the present invention to provide a test system and method which is particularly applicable to the testing of circuit chip devices employing level sensitive scan design (LSSD) layout and design rules.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
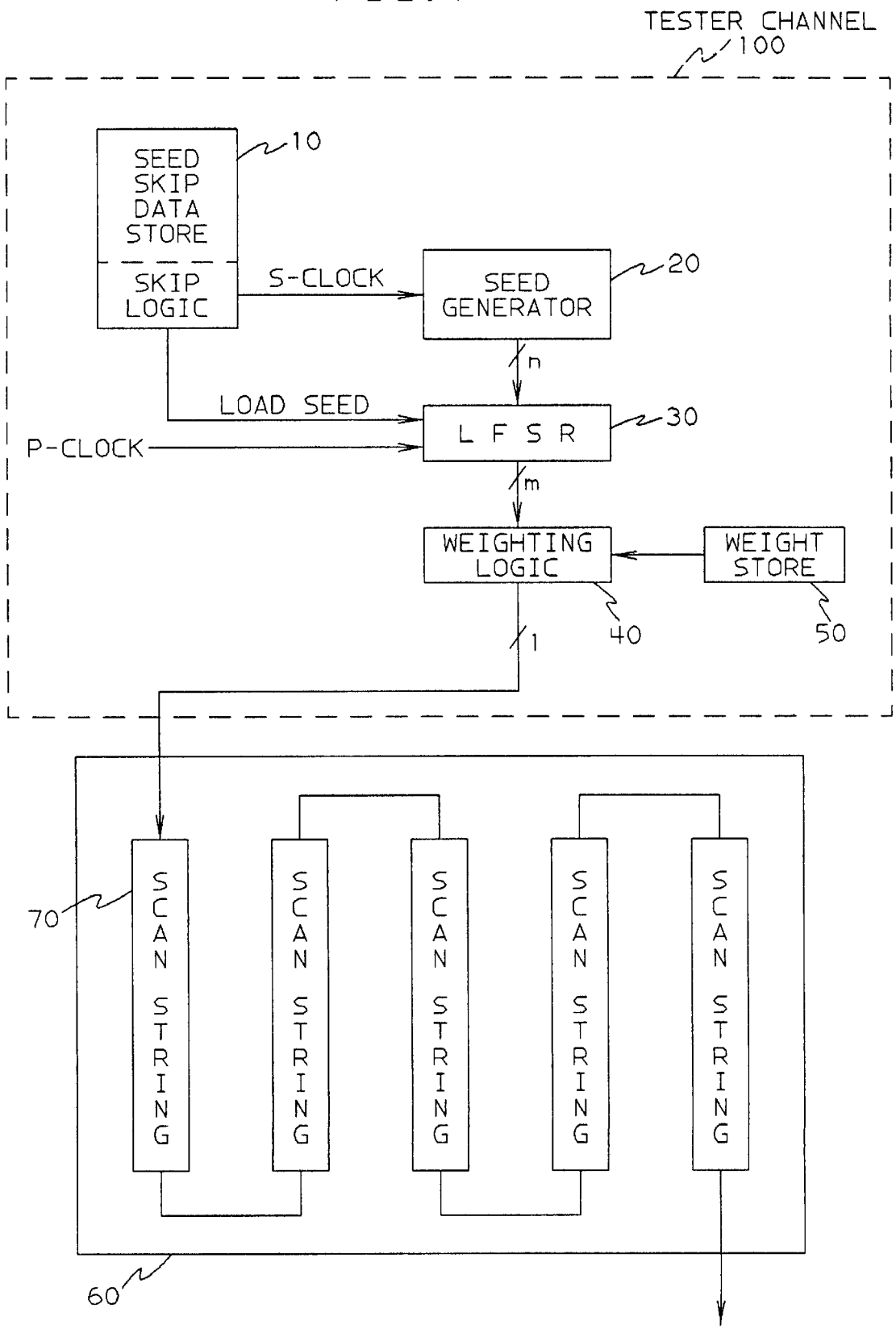
FIG. 1 is a functional block diagram illustrating a preferred embodiment of the present invention and which particularly illustrates the utilization of seed skip means.

FIG. 1 herein illustrates a preferred embodiment of the present invention. In particular, it is seen that circuits 10, 20, 30, 40 and 50 (described in detail below) operate to provide a one bit wide signal to device under test 60. This signal is typically provided to a single pin of an integrated circuit device or connected system of chips which are to be tested. In particular, the present invention is suitable for supplying appropriate test sequences to strings of shift register latches 70 disposed on a chip in accordance with level sensitive scan design (LSSD) rules. This self test methodology is more particularly described in U.S. Pat. No. 3,783,254. Additional relevant background information is to be found in U.S. Pat. Nos. 4,688,223; 4,801,870; and 3,761,695.

While the present invention is not limited to utilization with LSSD design methodologies, it is particularly suited for use with them in terms of some of the relative timing operations that occur. In particular, as will be discussed more thoroughly below, seed skipping operations are typically overlapped with shifting operations that occur in shift register latch string 70. Because of the overlapped timing of these two operations, it is seen that the system and method of the present invention are particularly well suited for supplying test patterns to LSSD built-in self test integrated circuits.

It should be appreciated that the system shown in FIG. 1 illustrates what is commonly referred to as a single channel for automated test equipment (ATE) devices. The typical configuration is for a single test channel to feed test signals to a single chip pin. It should therefore also be appreciated then that in preferable implementations of the present system, a plurality of test channel signal generators are provided so as to supply a plurality of different signals to multiple integrated circuits and/or to circuits having more than one test pin per device (or system).

The most relevant portion of the circuit shown in FIG. 1 is the linear feedback shift register 30 (LFSR). Such shift registers are well known devices which typically include strings of flip-flop circuits wherein data stored in adjacent flip-flop circuits is shifted either to the left or to the right in conformance with a clock signal supplied to the flip-flop devices. Additionally, feedback paths within the LFSR are established from selected flip-flop output lines back to selected data input lines, usually through a device operating as a modulo 2 summer. Such summers are equivalent to Exclusive-OR gates. Linear feedback shift register devices such as 30 have a plurality of flip-flop memory elements n and the feedback configuration is established so as to typically implement a form of polynomial multiplication wherein the coefficients of the polynomials are elements of a binary field. If the polynomial is chosen carefully in accordance with well known techniques, shift register 30 operates as a pseudo-random pattern generator. It is this aspect of shift register 30 which is most important for the practice of the present invention. In particular, it is seen that such shift registers are also equivalent to finite state machines and are capable of cycling through a plurality of states upon application of the p-clock signal shown. More particularly, a finite state machine feedback shift register 30 is also capable of starting from a given initial state. This initial state is referred to herein as a seed state. If shift register 30 contains n flip-flop memory devices, a new initial seed state will also be typically represented by a set of n bits which are herein supplied from seed generator 20. Upon occurrence of a load seed signal, a new seed is transferred from seed generator 20 to feedback shift register 30. In particular, the present invention is particularly concerned with the control of seeds supplied to LFSR 30. It should be noted that other types of Finite State Machine circuits usable for generating pseudo-random patterns could be employed instead of an LFSR.

Also, as indicated above, the present invention is directed to the generation of bit stream sequences based upon biased or weighted random test patterns. In particular, a set of signals from the output lines of the memory elements in shift register 30 are supplied to weighting logic 40. For purposes of integrated circuit testing carried out in accordance with the present invention, m such signal lines are supplied from shift register 30 to weighting logic 40. Weighting logic 40 typically comprises a set of gates which are controlled by signals from weight store 50. A typical circuit illustrating weighting logic for m=4 is shown in FIG. 3 of U.S. Pat. No. 4,801,870. In sum it is therefore seen that weighting logic 40 operates upon a plurality of output bit paths from register 30 in conjunction with weights stored in weight memory 50 to produce a desired pseudo-random test bit pattern to be supplied to the first flip-flop in a shift register latch scan string 70 on chip or circuit 60.

It is thus seen that the desired random test pattern is determined by seed values, by weight values and by the connection configuration within feedback shift register 30 (that is to say, it is determined in part by the polynomial implemented in the feedback shift register), of by the state transition function of an alternative random pattern generating circuit.

Most relevant to the present invention however, is the mechanism which is provided for skipping seed values which have been proven, in prior run tests (typically via software simulation), to be relatively ineffective for test purposes. In particular, these earlier run fault simulations are used to indicate which seeds produce ineffective test consequences. These seeds may then be skipped over during the testing of actual devices. Thus, from a given sequence of seeds it is only necessary to store information indicating the number of seeds to use and the number of seeds to skip. Thus seed skip data store 10 needs only to include a sequence of numbers. The numbers stored represent a relatively compact representation of the set of effective seeds.

Seed skipping means 10 preferably operates to insert these numeric values into a counter driven by the s-clock signal line. The s-clock signal line also is supplied to seed generator 20 to cause the production of a new seed value. The counter in the skip logic portion of skipping means 10 may be implemented in a countdown fashion so that when the desired number of seeds has been generated and transferred to shift register 30, the load seed signal line is turned off with the s-clock signal line allowed to run to seed generator 20 so that the desired number of seeds are skipped. The next skip increment in the seed skip data store may be loaded into the counter which may then be operated in a countdown fashion until the desired number of seeds are skipped. In this way, only desirable seeds are supplied and the testing of device 60 becomes much more efficient and effective.

Figure 2:
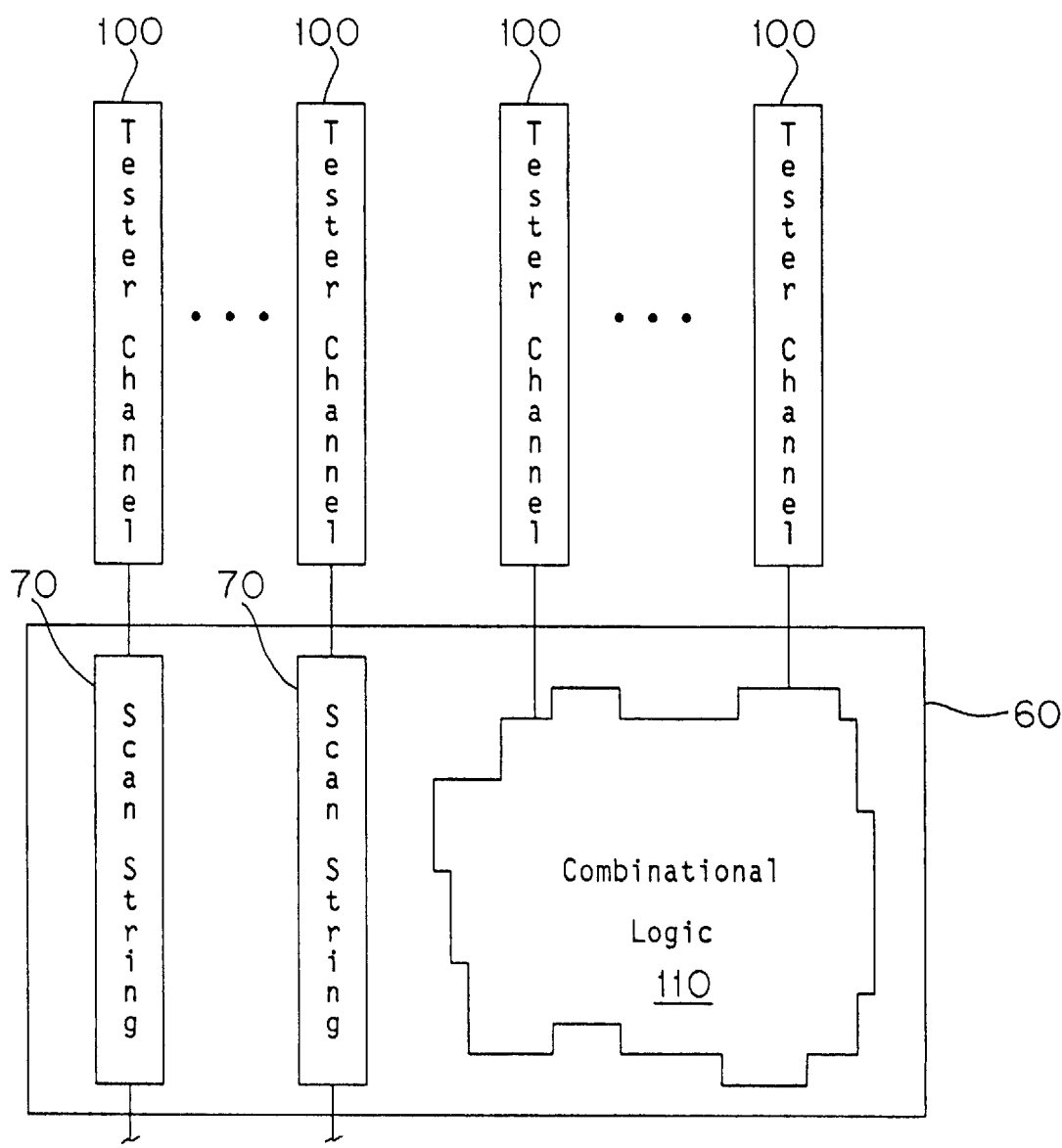
FIG. 2 is a functional block diagram illustrating the use of a plurality of test pattern generation circuits being used in a multi-channel test configuration in accordance with the present invention.

FIG. 1 illustrates the utilization of a single tester channel 100 in conjunction with a single shift register latch scan string 70. However, the present invention is generally utilized in a multi-channel configuration which is more particularly illustrated in FIG. 2. Tester channels 100 are seen therein to supply test pattern bit streams not only to scan strings 70 but also to combinational logic 110. In this fashion, multiple tester channels, such as those illustrated in FIG. 1, are used simultaneously to drive the product under test 60.

Attention is now more specifically directed to providing and understanding the reasons for the advantages resulting from the system shown in FIG. 1. In particular, the methods that are proposed herein for stored test data volume reduction are based on integrating the coded data representations into both the test generation software and the test application software and hardware. It is important to separate in one's mind the off-line test generation aspects from the on-line test application aspects of the present invention. In this respect, the method differs from the "universal pin electronics" (UPE) method described above which makes no assumptions about test generation algorithms. Such generality tends to make the coding software and the decoding hardware for such systems quite complex. However, integrating the coding into the test generation algorithm, it has been possible to provide more control over the types of codes which are used. In particular, one can control the complexity of the coding/decoding mechanisms. Where the UPE approach has had to rely on an arsenal of sophisticated codes, methods based on weighted random patterns are useable with very straight forward LFSR-based codes. In this latter scheme, patterns are generated in a coded form to begin with. Accordingly, it is one of the objects of the present invention to incorporate the use of weighted random patterns as a basis for generating deterministic test patterns which are representable in a very compact form. To achieve this, two modifications have been made to the test generation method.

The first modification provides a mechanism for separating effective test patterns from ineffective ones. Ineffective test patterns are patterns that do not detect a previously untested model fault. This separation can be accomplished by exploiting fault simulators which are already available. The fault simulator is used to identify faults detected by each test pattern. This information is used to determine the effective test patterns, that is those test patterns that detect at least one previously undetected fault. Each such test pattern is characterized by the associated set of signal weights, W, and by the pattern number, $p_n$. This characterization can be summarized in the following equation:

$$\text{Test Pattern} = F(W, p_n). \tag{1}$$

The total storage requirement for such a system is the storage required for the weights plus whatever is needed to define effective pattern numbers.

The second extension that is needed is the ability to reconstruct the actual test patterns from the stored information, that is from the weights and the pattern numbers. The pattern generation logic can be viewed as a finite state machine whose response is generated according to a list of parameters (the weights, W) and the initial state (the seed values, S) of the finite state machine for the pattern. This may be expressed symbolically as:

$$\text{Test Pattern} = F(W, S). \tag{2}$$

The seed for each pattern is determined by the pattern number in accordance with the relationship:

$$\text{Seed} = S(p_n). \tag{3}$$

This means that the pattern can be reconstructed by using the relationship:

$$\text{Pattern} = F(W, S(p_n)) = H(W, p_n). \tag{4}$$

In the previous implementations of the weighted random pattern test system, the seed function (Equation 3) is not explicitly calculated. Instead the seed for pattern number i is implicitly produced when generating pattern i−1. Here the final state of the LFSR after applying pattern i−1 becomes the seed for pattern i. To skip ineffective patterns, the LFSR would normally have to be cycled until it arrives at the next desired seed state. While this is possible in principle, it usually takes too much time to be practical. Thus more efficient methods for calculating effective seed states in advance are desired.

Accordingly, attention is now specifically directed to examples of appropriate seed calculation algorithms. In particular, what is needed is an efficient way of deriving a seed for an arbitrary next pattern number without having to cycle through all intermediate LFSR generated patterns. This is achieved in a variety of ways. Two examples are provided to illustrate the range of possibilities.

The first of these seed generation possibilities is now considered and is referred to as the single generator LFSR. It is possible to use a single generator LFSR to generate all of the bits for very long test patterns. An example of this is a 32 bit LFSR which supplies signals to hundreds or thousands of shift register latches in LSSD scan strings. In this case, the easiest method is simply to store the seeds for each effective pattern. Thus each pattern is defined by 32 bits of information over and above the information needed to define the weights. This should be compared however with having to store one bit per shift register latch that is, the need to store hundreds or thousands of bits.

The second approach to seed calculation algorithms discussed herein, is referred to as the lookahead LFSR function.

In particular, it is noted that automatic test equipment usually uses a separate LFSR for each tester channel. Thus storing the seeds for each LFSR for each pattern becomes much too stringent of a storage requirement and a different method for deriving the seeds from the pattern number is desired. However, it is also desired that the seed calculation not take a significant amount of time over and above the time it takes to apply a test. To avoid having to cycle through all intermediate states to get to the next effective pattern, it is possible to implement a fast lookahead function $LA_k$ into each tester channel. The function $LA_k$ precalculates the result of cycling the generator LFSR in the channel for k cycles. That is, k LFSR cycles are compressed into one cycle of the $LA_k$ function. The $LA_k$ function is easily implemented with a register and an Exclusive-OR network.

The value of k may in fact be implemented as a system wide test parameter, or could be selected differently for each channel. During test generation, the next seed for each channel LFSR is simply calculated by cycling the corresponding lookahead function once. The resulting next seed is equivalent to that obtained from the final state of a channel LFSR after scanning k shift register latches. In other words, reseeding occurs as if the product under test had scan strings with k shift register latches behind each input pin.

To skip over d ineffective patterns during test application, the lookahead function block is cycled d+1 times before the appropriate seed is available for loading into the channel LFSR. Note that instead of storing the pattern number $p_n$ explicitly, it suffices to store d. The maximum possible value of d depends on test generation parameters. The weighted random pattern system currently employed insures that each group of 256 patterns contains at least one effective pattern. Hence, d cannot exceed 511 (=2×256−1). Most actual values for d will be substantially smaller than this. The measured ratio between the number of weighted random patterns and deterministic patterns is less than 50 to 1, corresponding to an average value of less than 50 for the variable d. This ratio should not change significantly in the future. By storing d instead of $p_n$ the storage requirement is further reduced to 9 bits per effective test pattern over and above the weights.

The 50 cycles that are needed for seed precalculation may appear to add too much to the test time. This is however not true for practical circuit implementations. Test time is mainly a problem for large complex circuits. Such circuits generally contain a large number of storage elements in the LSSD scan strings. The test application time for these circuits is dominated by the time it takes to load and unload the scan strings. Each load/unload operation takes many tester cycles. The seed precalculation for the next pattern is preferably overlapped with the load/unload operation for the current pattern. As a result, there is no measurable time overhead increase from precalculating the seeds except in very few cases.

From the above, it should be appreciated that it is beneficial to employ weighted random patterns generated with linear feedback shift registers to derive compact, coded data representations for deterministic integrated circuit tests. Each effective test pattern requires only nine (or 32) bits of additional data over and above the weight data. Several methods for deriving the generator LFSR seeds from the effective pattern number have also been described. The proposed method achieves test data reduction of weighted random patterns without significantly increasing the number of applied patterns compared to stored pattern methods. Furthermore, based on initial experiences with the weighted random pattern test system, an overall test data reduction between one and two orders of magnitude is expected. The methods are useful in both manufacturing, test and in-service processor based system test applications.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A circuit for generating sequences of test pattern bits, especially for application to large integrated circuit chips and systems designed with at least one scan path for testing, said circuit comprising:

pseudo-random pattern generator means including a plurality of register elements and a means for cycling said generator means so as to provide an output bit stream;

weighting means for receiving said output bit stream from said pattern generator and for generating bit sequences having a selectively biased probability distribution of zeroes and ones in the bit sequences from said weighting means;

reseeding means for generating seed values to be loaded into the register elements within said pseudo-random pattern generator means at the beginning of new output bit streams; and seed skipping means for causing said reseeding means to depart from a pre-established seed sequence by skipping over specified numbers of otherwise generated seed values.

2. The circuit of claim 1 in which said pseudo-random pattern generator comprises a linear feedback shift register.

3. The circuit of claim 1 in which said seed skipping means includes a decrementing counter connected to a memory element containing entries indicative of the number of seed values to skip.

4. A method for testing a digital circuit device, said method comprising the steps of:

simulating test results, for a model of a digital circuit to be tested, using simulated test pattern bit streams generated in accordance with a weighted, pseudo-random process having selectable seed values;

determining from said simulating step which seed values from a sequence of seed values produce test results which are effective for detecting error conditions in said digital circuit;

storing, in a memory element, values which are indicative of which seed values in said sequence are to be skipped as a result of said effectiveness determining step; and applying a weighted, pseudo-random test pattern bit stream to an actual digital circuit device, said test pattern being generated using a reduced seed sequence based upon said skipping indicators in said memory element.

* * * * *